United States Patent
Van Brocklin et al.

(10) Patent No.: US 6,958,946 B2
(45) Date of Patent: Oct. 25, 2005

(54) MEMORY STORAGE DEVICE WHICH REGULATES SENSE VOLTAGES

(75) Inventors: Andrew L. Van Brocklin, Corvallis, OR (US); Peter Fricke, Corvallis, OR (US); John M. da Cunha, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 471 days.

(21) Appl. No.: 10/264,153

(22) Filed: Oct. 2, 2002

(65) Prior Publication Data

US 2004/0066689 A1 Apr. 8, 2004

(51) Int. Cl.[7] ................................................ G11C 5/14
(52) U.S. Cl. ...................... 365/228; 365/226; 365/96; 365/100; 365/105; 365/148; 365/163; 365/175
(58) Field of Search .......................... 365/96, 100, 105, 365/103, 148, 163, 175, 174, 228, 226

(56) References Cited

U.S. PATENT DOCUMENTS

| | | | |
|---|---|---|---|
| 3,706,023 A | * 12/1972 | Yamada et al. | 315/411 |
| 3,829,846 A | 8/1974 | Berg et al. | 365/49 |
| 4,442,509 A | 4/1984 | Herndon | 365/154 |
| 4,531,065 A | 7/1985 | Nakayama et al. | 327/545 |
| 4,651,302 A | 3/1987 | Kimmel et al. | 365/104 |
| 4,652,809 A | * 3/1987 | Barn | 323/282 |
| 4,910,706 A | 3/1990 | Hyatt | 365/45 |
| 4,984,207 A | 1/1991 | Tateno et al. | 365/208 |
| 5,103,425 A | 4/1992 | Kuo et al. | 365/185.23 |
| 5,193,073 A | 3/1993 | Bhuva | 365/226 |
| 5,339,275 A | 8/1994 | Hyatt | 365/45 |
| 5,726,944 A | 3/1998 | Pelley, III et al. | 365/226 |
| 5,777,940 A | 7/1998 | Su | 365/226 |
| 5,796,651 A | 8/1998 | Horne et al. | 365/156 |
| 6,385,075 B1 | 5/2002 | Taussig et al. | 365/105 |

OTHER PUBLICATIONS

IBM Corporation, "Esaki Diode Memory", IBM Technical Disclosure Bulletin, pp. 41–42, (Apr. 1961).

IBM Corporation, "Memory Circuits Power Gating Scheme", IBM Technical Disclosure Bulletin, pp. 2114–2115, (Dec. 1972).

IBM Corporation, "Memory Diode Array Circuit", IBM Technical Disclosure Bulletin, pp. 3353–3354, (Apr. 1972).

IBM Corporation, "Single Thyristor Static Memory and its Fabrication", IBM Technical Disclosure Bulletin, pp. 1017–1025, (Aug. 1980).

* cited by examiner

Primary Examiner—Andrew Q. Tran

(57) ABSTRACT

A memory storage device includes a memory cell configurable to have at least a first conductive state and includes a first and second conductor each electrically coupled to the memory cell. A regulation circuit is configured to regulate a sense voltage on the second conductor to be independent of a current conducted through the first conductor when the memory cell is configured to have the first conductive state.

29 Claims, 8 Drawing Sheets

MEMORY STORAGE DEVICE WHICH REGULATES SENSE VOLTAGES

THE FIELD OF THE INVENTION

The present invention generally relates to the field of integrated circuit memories. More particularly the present invention relates to a memory storage device and method for regulating sense voltages.

BACKGROUND OF THE INVENTION

As the demand for integrated circuits continues to rise, manufacturers labor to incorporate increasingly greater numbers of memory cells onto each die. Integrated circuit memories are typically organized into two dimensional arrays, wherein each memory cell in an array is intersected by a row conductor and a column conductor. Since many applications require low access times and high data transfer rates, the memories are organized so that data can be written to or read from multiple memory storage devices at the same time.

One popular type of memory is a read-only memory (ROM). Two common types of ROMs are mask ROMs and field programmable ROMs. In mask ROMs, the information stored in each memory cell is permanently programmed during the fabrication process and cannot be subsequently changed. Field programmable ROMs can be programmed after the fabrication process and are more desirable in certain applications because they enable end users to stock a single part type which can be used in many applications.

One type of field programmable ROM includes memory cells which have a storage element and a control component. Typically, storage elements are initially non-conductive or have a high resistance to current flow and can be programmed to be conductive or have a low resistance by application of a suitable voltage across the storage element. The programmed state of the storable element can be read by sensing a current which corresponds to the addressed memory cell being read.

One problem with conventional ROM memory arrays is that row or column line currents can combine and make accurate memory reads more difficult. For example, the row and column lines which intersect memory cells in the array travel the entire length of the array. If a particular row and multiple column lines are selected, the selected memory cells positioned along the common row line which are programmed to be conductive or have a low resistance provide currents which combine on the common row line. This increased common row line current can degrade the sense margins and make it more difficult to detect the difference between the non-programmed and programmed states of the memory cell.

In view of the above, there is a need for a memory which has an improved capability to detect the difference between non-programmed and programmed states when multiple memory cells are selected.

SUMMARY OF THE INVENTION

One aspect of the present invention provides a memory storage device and method. The memory storage device includes a memory cell configurable to have at least a first conductive state and includes a first and second conductor each electrically coupled to the memory cell. A regulation circuit is configured to regulate a sense voltage on the second conductor to be independent of a current conducted through the first conductor when the memory cell is configured to have the first conductive state.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
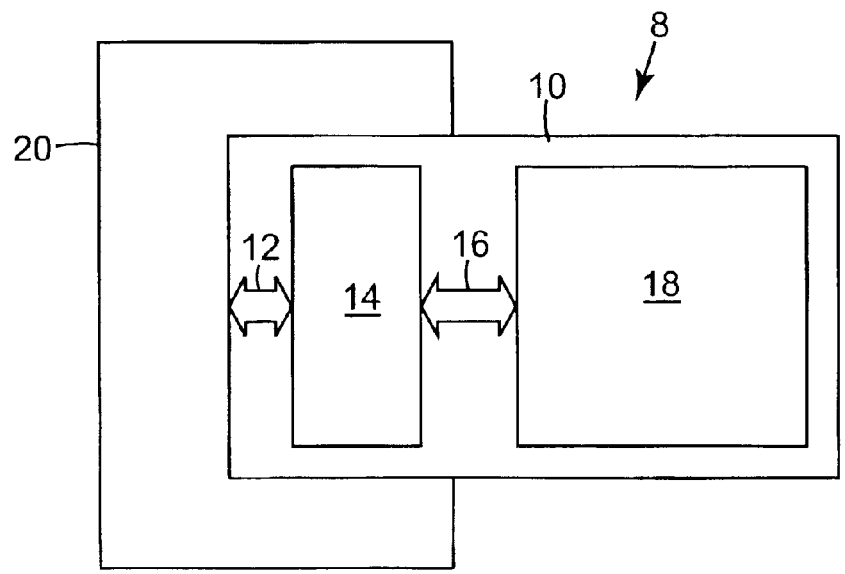
FIG. 1 is a block diagram of a memory storage system illustrating one embodiment of the invention.

FIG. 1 is a block diagram of a memory storage system or device 8 illustrating one embodiment of the invention. In the illustrated embodiment, memory storage device 8 includes a memory card 10 having an I/O interface connector 12 through which communication is made between the memory card 10 and a device 20 to which it is electrically coupled. Interface connector 12 is electrically coupled to an interface and control circuit 14 which in turn is connected to a removable memory module 18. Memory module 18 includes electrical devices used for data storage. In various embodiments, memory module 18 includes electrical circuits for addressing, control, detection, error correction coding (ECC), and other suitable functions. In one embodiment, memory module 18 is inserted into a socket in memory card 10 and can be removed and replaced with another memory module 18. In the illustrated embodiment, when inserted into memory card 10, memory module 18 is electrically coupled to interface and control circuit 14 through an internal interface 16.

Figure 2:
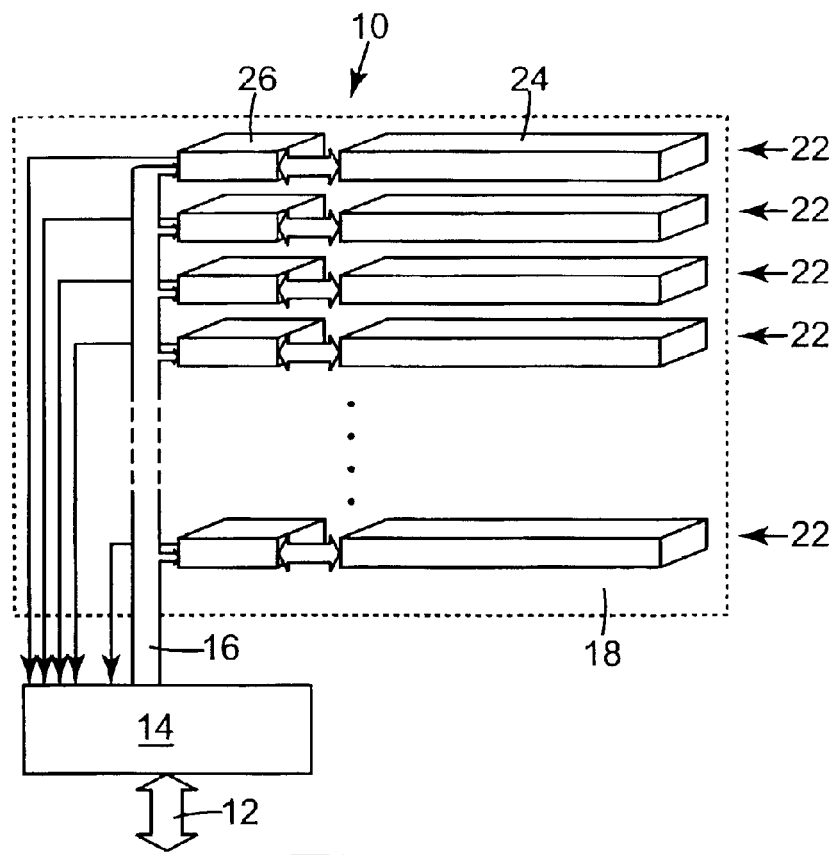
FIG. 2 is a block diagram of a memory card illustrating one embodiment of a memory module.

FIG. 2 is a block diagram of a memory card 10 illustrating one embodiment of a memory module 18. In the illustrated embodiment, memory module 18 is electrically coupled to interface and control circuit 14. In one embodiment, memory module 18 is constructed from a stack of laminated layers 22. In one embodiment, each laminated layer 22 has a memory cell array 24 of memory cells 40 that provide the data storage (see also, FIGS. 4A and 4B). The layers 22 include addressing circuits 26 which couple the respective memory cell arrays 24 through internal interface 16 to interface and control circuit 14. In one embodiment, addressing circuits 26 on each layer 22 enable fewer interconnecting conductors between layers 22 of memory module 18, which reduces the number of fabrication steps and lowers cost.

Figure 3:
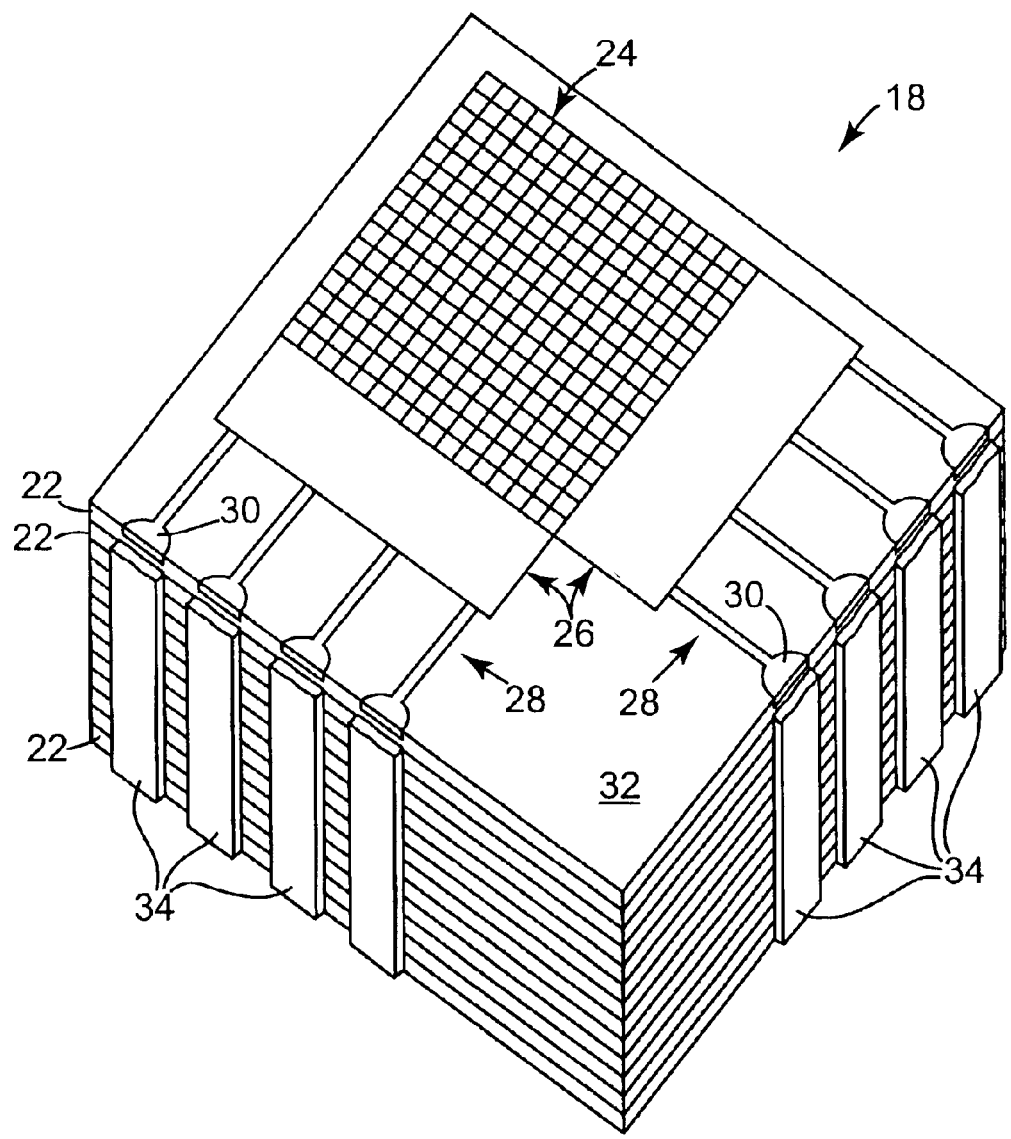
FIG. 3 is a cut-away isometric view illustrating one embodiment of a memory module.

FIG. 3 is a cut-away isometric view illustrating one embodiment of a memory module 18. In the illustrated embodiment, each of the layers 22 includes a memory cell array 24 and addressing circuits 26 formed on a substrate 32. Memory cell array 24 includes memory cells 40. In one embodiment, addressing circuits 26 include column and row multiplexing circuits which are positioned to be adjacent to respective orthogonal edges of memory cell array 24. In one embodiment, input/output (I/O) leads 28 are formed on substrate 32 during the fabrication process. In one embodiment, row I/O leads 28 extend from addressing circuits 26 to a first adjacent edge of substrate 32, and column I/O leads 28 extend from addressing circuits 26 to a second adjacent edge of substrate 32. In the illustrated embodiment, each of the I/O leads 28 terminates at respective contact pads 30. Portions of contact pads 30 are illustrated as being exposed at the edges of substrate 32.

In the illustrated embodiment, layers 22 are stacked in the same orientation and are laminated together. In other embodiments, layers 22 can be stacked in other suitable orientations. In the illustrated embodiment, electrical contact is made to the exposed portions of the contact pads 30 of layers 22 by conductive contact elements 34, which are illustrated in partial cut-away view. The contact elements 34 extend along the sides of the memory module 18, in a direction which is transverse to the plane of the individual layers 22. Each contact element 34 makes electrical contact to respective contact pads 30 of one or more of the layers 22. In one embodiment, contact elements 34 couple memory module 18 through internal interface 16 to interface and control circuit 14. In one embodiment, each of the layers 22 is formed from a polymer plastics material. In other embodiments, other suitable materials are used to form the layers 22.

Figure 4A:
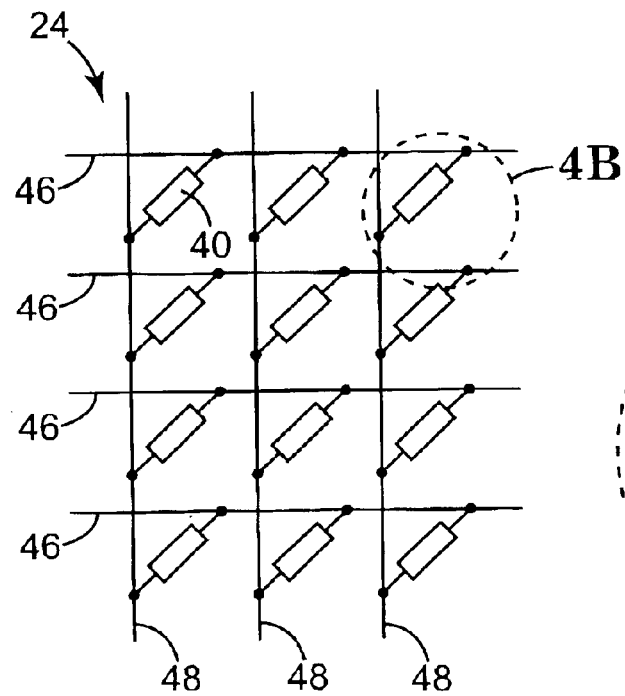
FIGS. 4A and 4B are diagrams illustrating one embodiment of a memory cell used in a memory array.
Figure 4B:
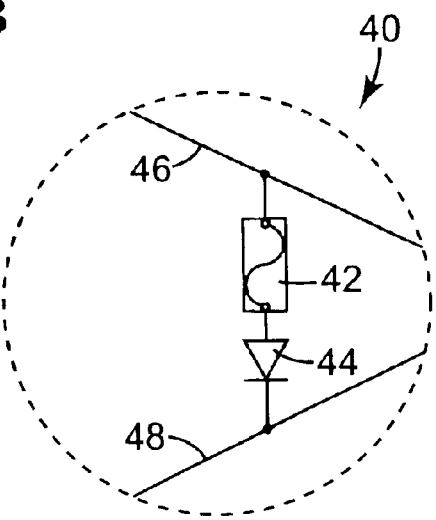

FIG. 4A is a diagram illustrating one embodiment of memory cells 40 used in memory cell array 24. In the illustrated embodiment, memory cell array 24 includes memory cells 40 which are formed on each of the layers 22 in memory module 18. Memory cell array 24 also includes conductive row lines 46 and conductive column lines 48. Each memory cell 40 is located at an intersection of a row line 46 and a column line 48. Each memory cell 40 includes a storage element 42 in series with a control element 44. Storage element 42 provides data storage for memory cell 40 and control element 44 facilitates addressing of memory cell 40 through the use of row lines 46 and column lines 48 for writing or reading stored data. One embodiment of memory cell 40 is illustrated in greater detail in FIG. 4B.

In one embodiment, each memory cell 40 includes a write-once storage element 42. A write-once storage element 42 can only be written once and cannot be subsequently changed. In one embodiment, the write-once storage elements 42 are fabricated so that each memory cell 40 has an initial first storage state of logic "0". During a write procedure, selected memory cells 40 can be changed to a second storage state which is a logic "1". Once a logic "1" is written to selected memory cells 40, the selected memory cells 40 cannot be changed back to a logic "0". In another embodiment, the write-once memory cells 40 are fabricated so that each memory cell 40 has an initial first storage state of logic "1". During a write procedure, selected memory cells 40 can be changed to a second storage state which is a logic "0". Once a logic "0" is written to selected memory cells 40, the selected memory cells 40 cannot be changed back to a logic "1". In other embodiments, memory cells 40 are configurable to be written or changed any suitable number of times between a logic "0" and a logic "1".

In one embodiment, each memory cell 40 includes an anti-fuse storage element 42. Anti-fuse storage element 42 is programmed by applying a programming voltage across memory cell 40 to change the resistance of anti-fuse storage element 42. In one embodiment, memory cell 40, before being programmed, is configured to have a first resistance state. In this embodiment, memory cell 40, after being programmed, is configured to have a second resistance state. In one embodiment, memory cell 40 configured in the first resistance state has a resistance value of at least one megaohm. In one embodiment, memory cell 40 configured in the second resistance state has a second resistance value of 100 kilohms or less. In one embodiment, anti-fuse storage element 42 is configured to be electrically substantially non-conductive or have a non-conductive state before being programmed and is configured to be electrically conductive or have a conductive state after being programmed. In one embodiment, the first resistance value or the non-conductive state of anti-fuse storage element 42 represents one logic state, such as a logic "0". After being programmed, the second resistance state or the conductive state of anti-fuse storage element 42 represents the opposite logic state, such as a logic "1". In one embodiment, the first resistance state or the non-conductive state of anti-fuse storage element 42 represents one logic state, such as a logic "1". After being programmed, the second resistance state or the conductive state of anti-fuse storage element 42 represents the opposite logic state, such as a logic "0".

In other embodiments, memory cell 40 is configurable to have any suitable number of conductive states. In various embodiments, memory cell 40 is configurable to have different resistance values in different conductive states. In various embodiments, memory cell 40 is configurable to be programmed in any suitable number of conductive states any suitable number of times.

In other embodiments, each memory cell 40 can include any suitable storage element 42 in series with any suitable control element 44. In one embodiment, a fuse element 42 is coupled in series with a control element 44, such as a diode control element. In one embodiment, storage element 42 or control element 44 can be formed by any suitable number of layers of materials. In one embodiment, storage element 42 is a tunnel junction storage element 42 and control element 44 is a tunnel junction control element 44.

In one embodiment, each memory cell 40 includes a fuse element 42 that is initially conductive. The conductive state of fuse element 42 represents one logic state, such as a logic "0". In order to write data to memory array 24, each memory cell 40 selected to store a logic "1" is addressed using the row lines 46 and column lines 48 and its fuse element 42 is blown, thereby placing it in a non-conductive state. The non-conductive state of fuse element 42 represents an opposite logic state, such as a logic "1". In other embodiments, the conductive state represents a logic "1" and the non-conductive state represents a logic "0". In one embodiment, blowing fuse element 42 is a one-way operation and memory cells 40 are write-once memory cells 40. In other embodiments, fuse element 42 can be programmed to be in the non-conductive state and programmed again to be in the conductive state.

In one embodiment, a data writing operation is performed by applying a predetermined current between a selected column line 48 and a selected row line 46 which is sufficient to blow fuse element 42 of memory cell 40. In one embodiment, a reading operation is performed by using a selected row line 46 and a selected column line 48 to sense the stored resistance state of the memory cells 40.

In the illustrated embodiment, control element 44 is a diode element 44 and is used to address selected memory cells 40 via the row lines 46 and the column lines 48. Without diode elements 44, many current paths would exist through memory cells 40 between selected row lines 46 and column lines 48. Diode elements 44 form a one-way conduction path through each memory cell 40 so that a single row line 46 and a single column line 48 can be used to uniquely address and pass current through a selected single memory cell 40.

Figure 5:
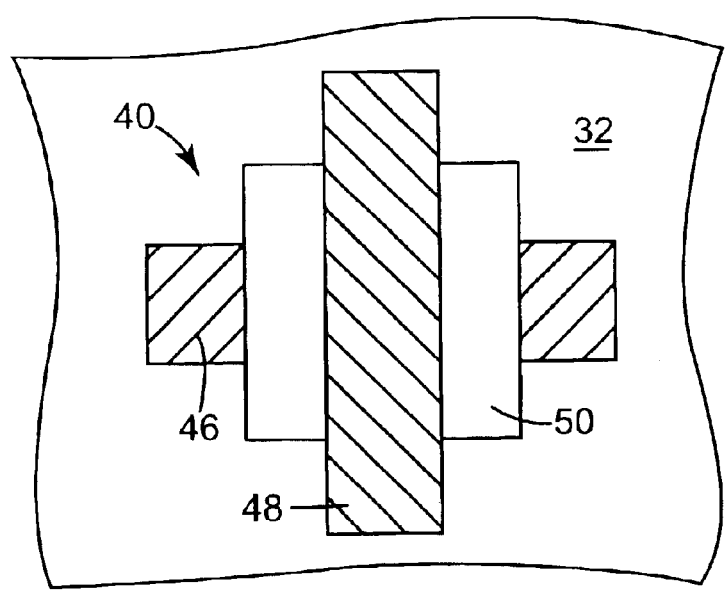
FIG. 5 is a simplified plan view illustrating one embodiment of memory cell.

FIG. 5 is a simplified plan view illustrating one embodiment of a memory cell 40 formed on a substrate 32. In the illustrated embodiment, memory cell 40 is located at an intersection of a row line 46 and a column line 48. In one embodiment, row lines 46 and column lines 48 are orthogonal. At each intersection of a row line 46 and a column line 48, a connection is made to a memory cell 40. In one embodiment, memory cell 40 includes storage element 42 and control element 44 electrically coupled together in series. In one embodiment, control elements 44 comprise diodes 44 oriented so that if a common potential is applied between all the row lines 46 and all the column lines 48, all of the diodes 44 are biased in the same direction.

In the illustrated embodiment, a semiconductor layer 50 is illustrated as a single layer to simplify the description of the invention. In practice, semiconductor layer 50 is formed of a suitable number of layers of different materials to form memory cell 40. In various embodiments, the layers include materials that are semiconductor materials, or include materials such as metals or dielectrics. In various embodiments, the materials are organized into layers which form storage element 42 and control element 44. In other embodiments, storage element 42 and control element 44 are formed separately.

Figure 6:
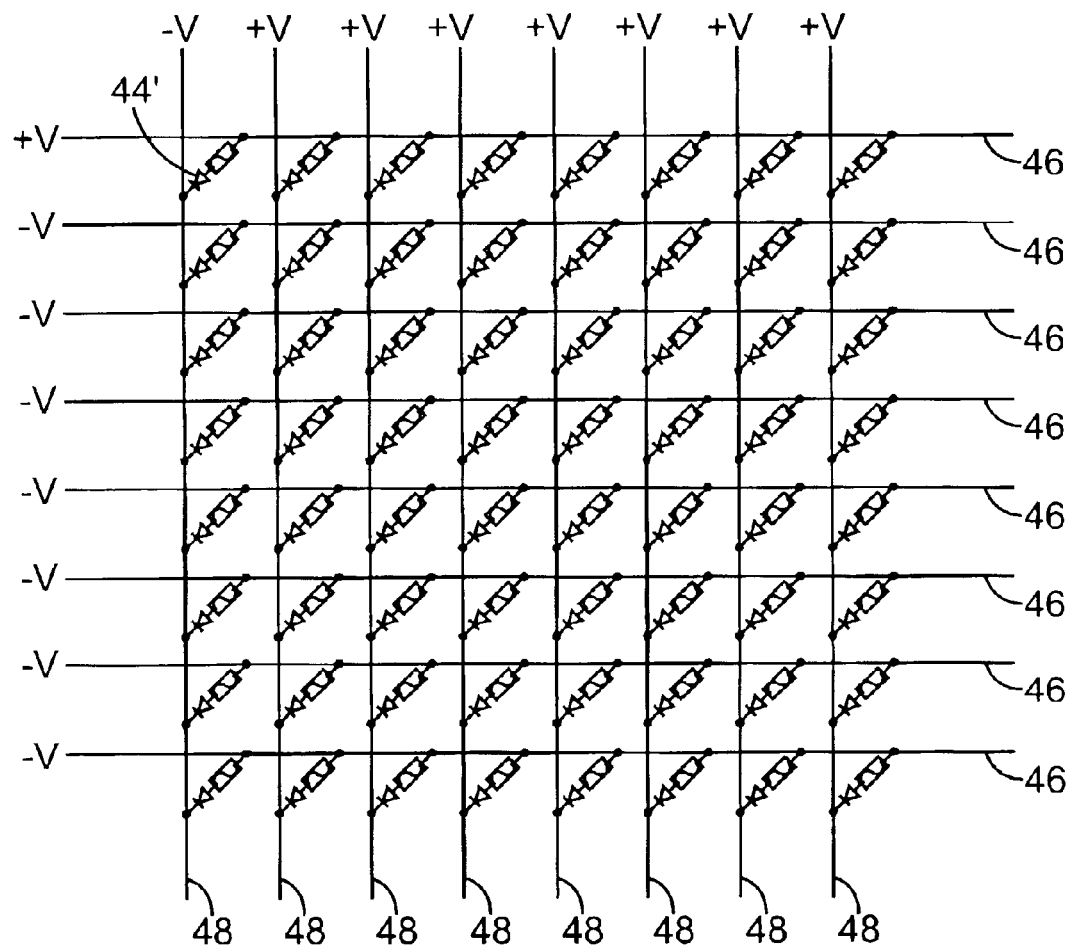
FIG. 6 is a schematic diagram illustrating one exemplary embodiment of a memory cell array.

FIG. 6 is a schematic diagram illustrating one exemplary embodiment of a memory cell array 24. In the exemplary embodiment illustrated in FIG. 6, an eight row by eight column memory cell array 24 is illustrated. In other embodiments, memory cell arrays 24 of other suitable sizes can be used.

In the exemplary embodiment, only one memory cell 40 is selected. Voltages are applied to row lines 46 and column lines 48 so that all of the row lines 46 except one selected row line 46 are biased at a potential of "−V", and the one selected row line 46 is biased at a potential of "+V". In the exemplary embodiment, all of the column lines 48 except one selected column line 48 are biased at the potential of "+V" and the one selected column line 48 is biased at a potential of "−V". In this exemplary embodiment, only a selected diode 44' of the selected memory cell 40 is forward biased.

In the exemplary embodiment illustrated in FIG. 6, the selected diode 44' is located in the upper left corner of memory array 24 and is selected and forward biased. In other illustrative embodiments, any one or more memory cells 40 can be selected so that corresponding diodes 44 are forward biased. In the exemplary embodiment of FIG. 6, the non-selected diodes 44 which are electrically coupled to the selected row line 46 and the selected column line 48 have no bias voltage applied. The remaining diodes 44 in the memory array 24 are reverse biased. If a current is conducted between the selected row line 46 and the selected column line 48 with the applied voltage potentials illustrated in FIG. 6, then the selected storage element 42 electrically coupled to the selected diode 44', and thus the selected memory cell 40, is configured to have the second resistance state or the conductive state. Conversely, if little or no current is conducted in this configuration, then the selected storage element 42 and thus the selected memory cell 40, is configured to have the first resistance state or the non-conductive state.

In the exemplary embodiment, to change the stored logic state in selected memory cell 40, the amplitudes of the voltages applied to the selected row lines 46 and selected column lines 48 can be changed to result in a current that exceeds the threshold current of storage element 42. This causes storage element 42 to change states. In various embodiments, the threshold voltage or current required to change the state of selected storage elements 42 can be set to a suitable value when memory array 24 is fabricated. In one embodiment, the threshold voltage or current is related to the current density through memory cell 40, and the threshold voltage or current can be adjusted by varying the junction area of storage element 42. In one embodiment, the cross-sectional area of the intersection of row lines 46 and column lines 48 is reduced which also reduces the threshold voltage or current required to be applied to reach the critical current density necessary to change the state of storage element 42.

Figure 7:
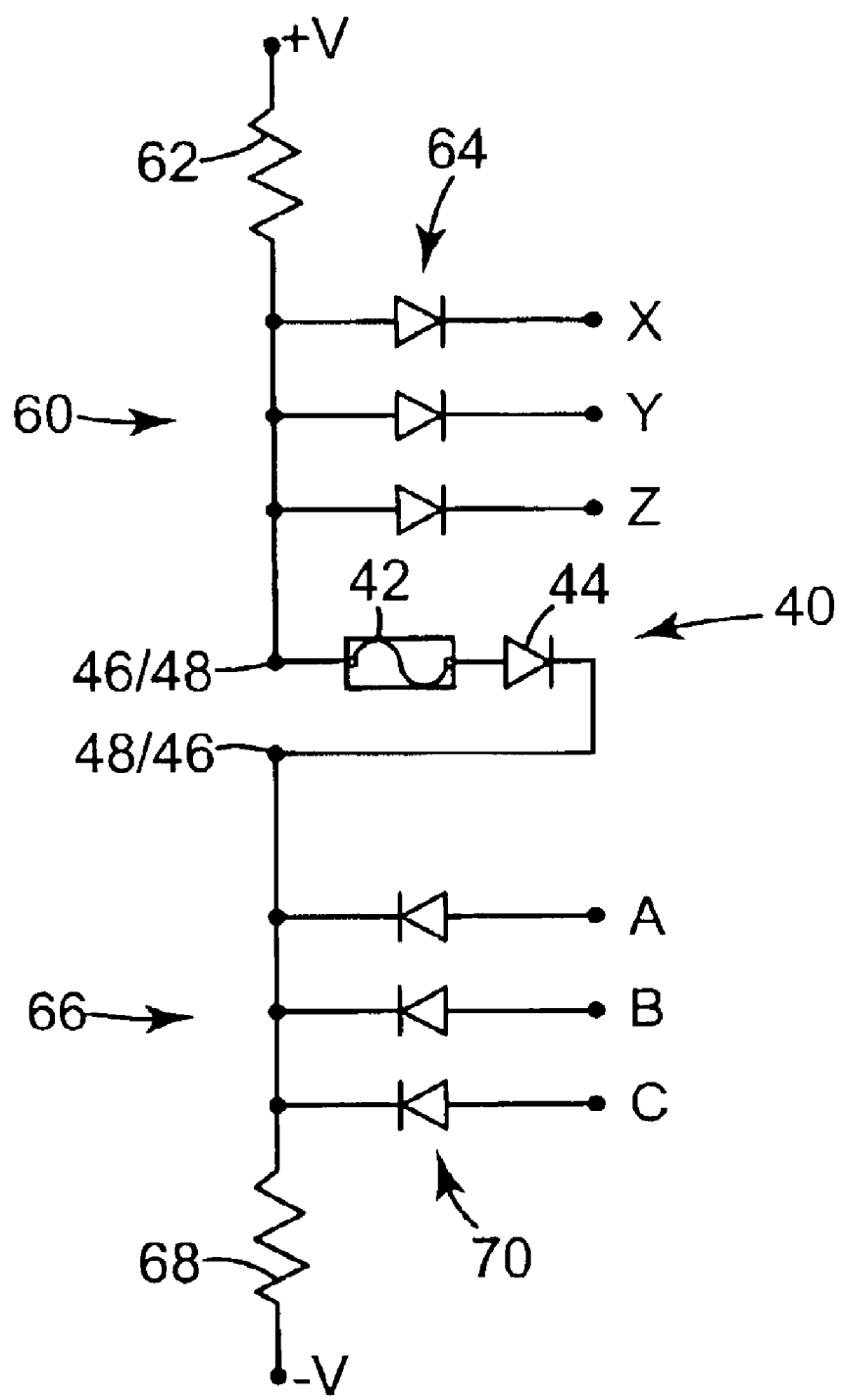
FIG. 7 is a schematic diagram illustrating a portion of one embodiment of a memory cell array addressing circuit.

FIG. 7 is a schematic circuit diagram illustrating a portion of one embodiment of a memory cell array addressing circuit. In one embodiment, address multiplexing and demultiplexing functions are performed using a logic scheme referred to as permuted diode logic. In the illustration of FIG. 7, a memory cell 40 includes a storage element 42 and a control element 44 in series. In the illustrated embodiment, control element 44 comprises a diode 44. The memory cell 40 is coupled between a line 46/48 and a line 48/46. An address diode logic circuit 60 is coupled to line 46/48, and an address diode logic circuit 66 is coupled to line 48/46. The address circuit 60 includes a resistive element 62 or first resistor 62 coupled between line 46/48 and a pull-up or first voltage +V. The address circuit 60 also includes address diodes 64 having anodes coupled to the lines 46/48 and cathodes controlled by respective address input voltages represented by X, Y and Z. An address diode logic circuit 66 is similarly constructed with a resistive element 68 or second resistor 68 coupled between line 48/46 to a pull-down or second voltage −V. The address diodes 70 have cathodes coupled to line 48/46, and anodes controlled by respective address input voltages represented by A, B and C. In one embodiment, line 46/48 is a row line 46 and line 48/46 is a column line 48. In one embodiment, line 46/48 is a column line 48 and line 48/46 is a row line 46.

In one exemplary embodiment, address circuit 60 uses logic levels of +V and −(V+ΔV) for the row address input voltages (X, Y, Z). In the exemplary embodiment, when the voltage +V represents a logic "1", the row address circuit 60 functions as an AND gate with the diode cathodes (X, Y, Z) as inputs and the line 46/48 as an output. The line 46 is high (+V) only if all three row address inputs (X, Y, Z) are high. Similarly, address circuit 66 functions as a negative logic AND gate. In this case, if logic levels of −V and (V+ΔV) are applied at the address inputs (A, B, C), the output at line 48/46 is −V when all three inputs are at −V. If the address inputs (X, Y, Z) all apply cathode voltages of +V to the corresponding diodes 64 and the address inputs (A, B, C) all apply anode voltages of −V to the corresponding diodes 70, then the memory cell 40 is selected. In the embodiment illustrated in FIG. 7, only three diodes 64 and three diodes 70 are illustrated, however, in other embodiments, any suitable number of diodes 64 or 70 can be used and any suitable number of addressing inputs can be used. Additional information about address multiplexing and demultiplexing functions is disclosed and described in U.S. Pat. No. 6,385,075, which is hereby incorporated by reference.

Figure 8:
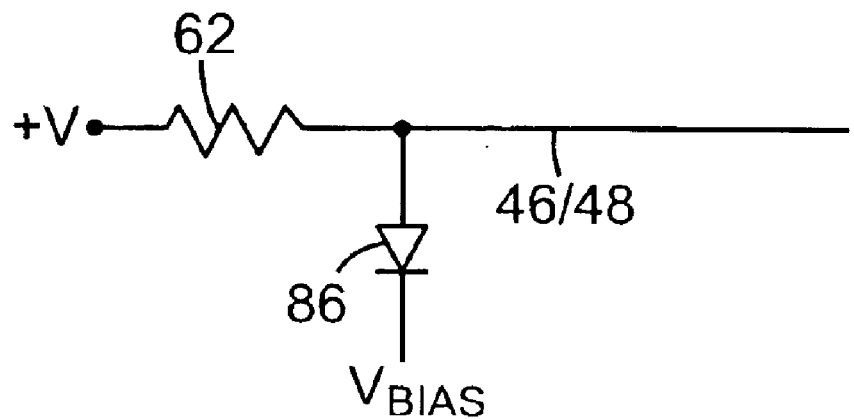
FIG. 8 is a schematic diagram illustrating first and second exemplary embodiments of a regulation circuit.

FIG. 8 is a schematic diagram illustrating first and second exemplary embodiments of a regulation circuit 86. In the first exemplary embodiment, the regulation circuit includes a diode 86 which is electrically coupled between a bias voltage ($V_{BIAS}$) voltage source and line 46/48. In the first exemplary embodiment, line 46/48 is a row line 46.

In the first exemplary embodiment, each row line 46 terminates at a resistor 62 and each column line 48 terminates at a resistor 68. When more than one column line 48 is addressed, the memory cells 40 are effectively connected through multiple resistors 68 in parallel to the −V voltage, and through only one resistor 62 to the +V voltage. Since the number of memory cells 40 which conduct current is unknown, the voltage drop across resistor 62 is unknown, and the sense voltage margin can be degraded. In one embodiment, the voltage $V_{BIAS}$ is set to a level sufficiently less than the +V voltage so that a difference between the +V voltage and the $V_{BIAS}$ voltage is greater than a voltage drop across resistor 62 which would result if all the current conducted through row line 46 was conducted through resistor 62. In one embodiment, the maximum voltage drop across resistor 62 is proportional to the number of column lines 48 which are supplying current through resistor 62. In one embodiment, all of the column lines 48 are addressed and all of the memory cells 40 coupled between the column lines 48 and the row line 46 are in the conductive state or the second resistance state and are conducting current through resistor 62.

In the second exemplary embodiment illustrated in FIG. 8, the regulation circuit includes a diode 86 which is electrically coupled between a $V_{BIAS}$ voltage source and line 46/48. In the second exemplary embodiment, line 46/48 is a column line 48.

In the second exemplary embodiment, each row line 46 terminates at a resistor 68 and each column line 48 terminates in a resistor 62. When more than one column line 48 is addressed, the memory cells 40 are effectively connected through multiple resistors 68 in parallel to the −V voltage and through only one resistor 62 to the +V voltage. Since the number of memory cells 40 which conduct current is unknown, the voltage drop across resistor 62 is unknown and the sense voltage margin can be degraded. In one embodiment, the voltage $V_{BIAS}$ is set to a level sufficiently less than the +V voltage so that a difference between the +V voltage and the $V_{BIAS}$ voltage is greater than a voltage drop across resistor 62 which would result if all the current conducted through column line 48 was conducted through resistor 62. In one embodiment, the maximum voltage drop across resistor 62 is proportional to the number of row lines 46 which are supplying current through resistor 62. In one embodiment, all of the row lines 46 are addressed and all of the memory cells 40 coupled between the column line 48 and the row lines 46 are in the conductive state or the second resistance state and are conducting current through resistor 62.

Figure 9:
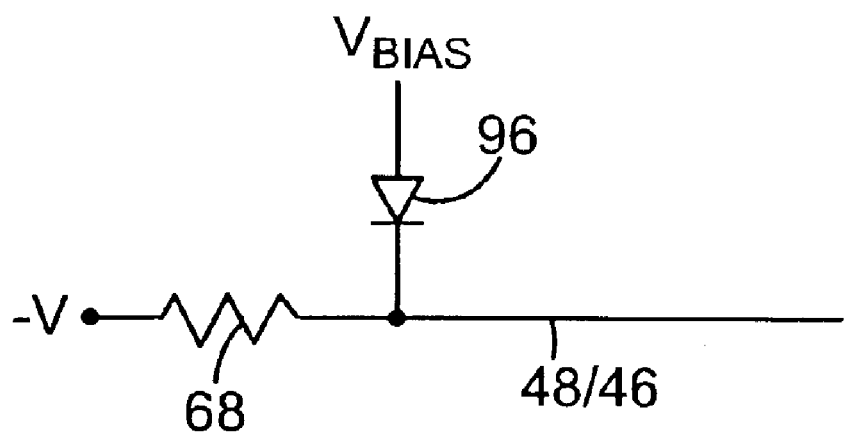
FIG. 9 is a schematic diagram illustrating third and fourth exemplary embodiments of a regulation circuit.

FIG. 9 is a schematic diagram illustrating third and fourth exemplary embodiments of a regulation circuit 96. In the third exemplary embodiment, regulation circuit 96 includes a diode 96 which is electrically coupled between a $V_{BIAS}$ voltage source and a line 48/46. In the third exemplary embodiment, line 48/46 is a column line 48.

In the third exemplary embodiment, each row line 46 terminates at a resistor 62 and each column line 48 terminates at a resistor 68. When more than one row line 46 is addressed, the memory cells 40 are effectively connected through multiple resistors 62 in parallel to the +V voltage and through only one resistor 68 to the −V voltage. Since the number of memory cells 40 which conduct current is unknown, the voltage drop across resistor 68 is unknown and the sense voltage margin can be degraded. In one embodiment, the voltage $V_{BIAS}$ is set to a level sufficiently greater than the −V voltage so that a difference between the $V_{BIAS}$ voltage and the −V voltage is greater than a voltage drop across resistor 68 which would result if all the current conducted through column line 48 was conducted through resistor 68. In one embodiment, the maximum voltage drop across resistor 68 is proportional to the number of row lines 46 which are supplying current through resistor 68. In one embodiment, all of the row lines 46 are addressed and all of the memory cells 40 coupled between the column line 48 and the row lines 46 are in the conductive state or the second resistance state and are conducting current through resistor 68.

In the fourth exemplary embodiment illustrated in FIG. 9, regulation circuit 96 includes a diode 96 which is electrically coupled between a $V_{BIAS}$ voltage source and a line 48/46. In the fourth exemplary embodiment, line 48/46 is a row line 46.

In the fourth exemplary embodiment, each row line 46 terminates at a resistor 68 and each column line 48 terminates at a resistor 62. When more than one column line 48 is addressed, the memory cells 40 are effectively connected through multiple resistors 62 in parallel to the +V voltage and through only one resistor 68 to the −V voltage. Since the number of memory cells 40 which conduct current to the resistor 68 is unknown, the voltage drop across resistor 68 is unknown and the sense voltage margin can be degraded. In one embodiment, the voltage $V_{BIAS}$ is set to a level sufficiently greater than the −V voltage so that a difference between the $V_{BIAS}$ voltage and the −V voltage is greater than a voltage drop across resistor 68 which would result if all the current conducted through row line 46 was conducted through resistor 68. In one embodiment, the maximum voltage drop across resistor 68 is proportional to the number of column lines 48 which are supplying current through resistor 68. In one embodiment, all of the column lines 48 are addressed and all of the memory cells 40 coupled between the row line 46 and the column lines 48 are in the conductive state or the second resistance state and are conducting current through resistor 68.

Figure 10:
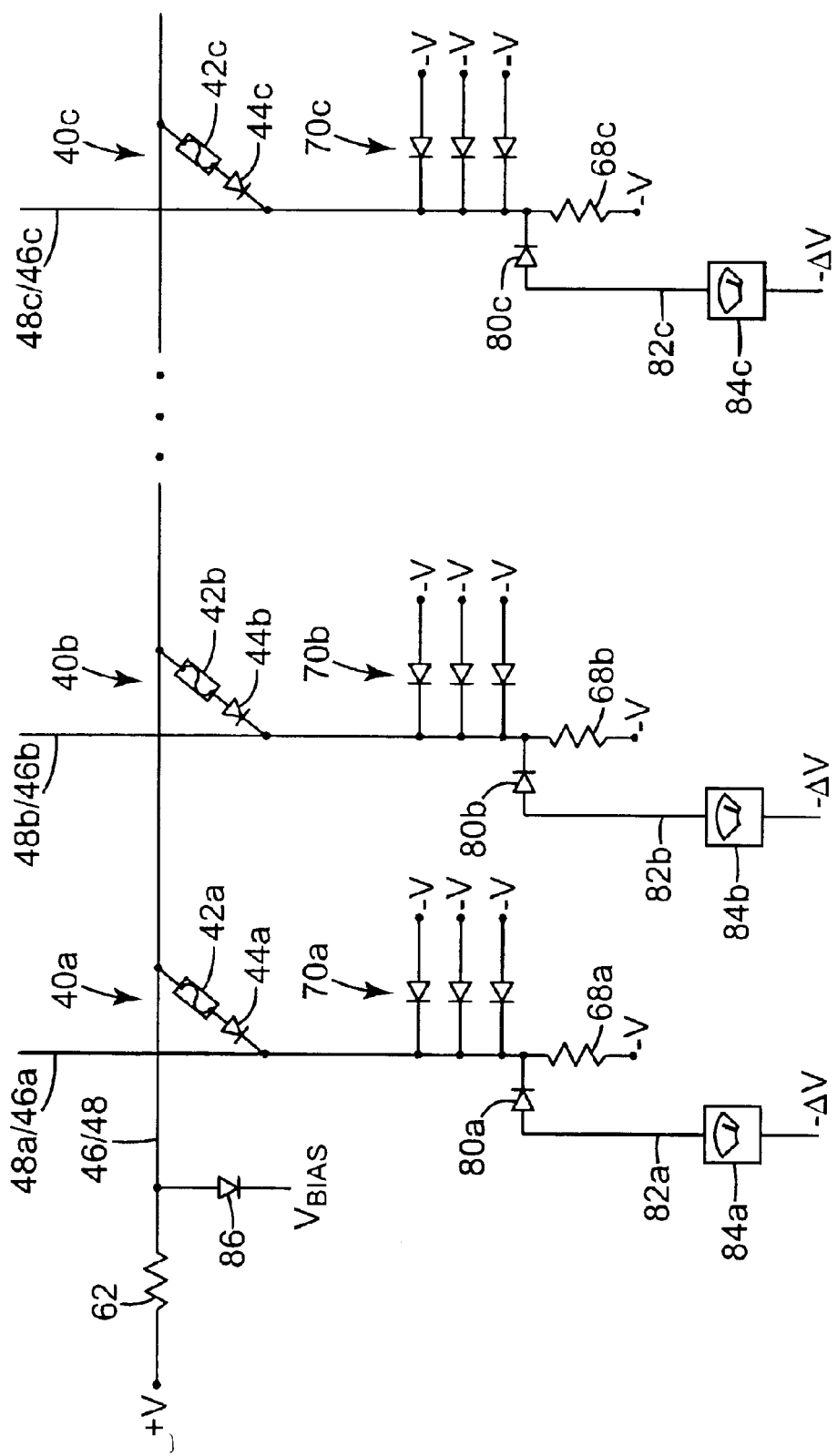
FIG. 10 is a schematic diagram illustrating first and second exemplary embodiments of the regulation circuit of FIG. 8 included in a partial memory cell array.

FIG. 10 is a schematic diagram illustrating first and second exemplary embodiments of the regulation circuit 86 of FIG. 8 included in a partial memory cell array 24. Three memory cells 40 are illustrated which are coupled to respective addressing circuits 70. Each of the three memory cells 40 are coupled between corresponding lines 48/46 and a common line 46/48. In the first and second exemplary embodiments, only three lines 48/46, three memory cells 40, and a common line 46/48 are illustrated to simplify the explanation of the invention. In other embodiments, any suitable number of lines 48/46, memory cells 40, and lines 46/48 can be used.

In the first and second exemplary embodiments illustrated in FIG. 10, each sense line 82 is coupled to a line 48/46 through a respective sense diode 80. Each diode 80 has a cathode coupled to a corresponding line 48/46 and an anode coupled to a sense current meter 84. In various embodiments, sense current meter 84 can be any suitable circuit function which is responsive to sense current flowing through sense line 82.

In the first and second exemplary embodiments illustrated in FIG. 10, each memory cell 40 is selected by addressing circuits 70 at lines 48/46, because the anodes of the diodes in addressing circuits 70 are at the −V voltage level. Each memory cell 40 is also selected at line 46/48 by an addressing circuit which is not illustrated to simplify the description of the invention. For each memory cell 40 which is in the non-conductive state or the first resistance state, currents will flow through sense diodes 80 and sense lines 82. For each memory cell 40 which is in the conductive state or the second resistance state, little or no current will flow in corresponding sense lines 82.

In one embodiment, the bias level of −ΔV is set to a value which is suitably greater than −V so that diodes 80 are forward-biased when the corresponding memory cells 40 are in the non-conductive state or the first resistance state. In one embodiment, the value of −ΔV is set to a value which is suitably less than the value of $V_{BIAS}$ so that diodes 80 are reverse-biased when the corresponding memory cells 40 are in the conductive state or the second resistance state. In one embodiment, the values of −ΔV define a detect margin for addressing circuits 70.

In the first and second exemplary embodiments illustrated in FIG. 10, a single-ended sensing approach is used. With single-ended sensing, the sense currents are conducted from only one of the +V or −V voltage sources when corresponding memory cells 40 are addressed and are configured in the non-conductive state or the first resistance state. In the first and second exemplary embodiments, the sense current is conducted from the −V voltage source. In other embodiments, the sense current is conducted from the +V voltage source, or from both the +V and −V voltage sources.

In the first and second exemplary embodiments illustrated in FIG. 10, when two or more memory cells 40 are addressed and are configured in the non-conductive state or the first resistance state, currents are conducted between the multiple −V voltage sources and corresponding resistors 68 and the +V voltage source and resistor 62. Since the sense diodes 80 appear to be connected through the multiple resistors 68 in parallel, if $V_{BIAS}$ is set to be equal to the +V voltage, the sense margins are reduced. If the sense margins are reduced to a sufficiently low value, the voltage at the cathodes of sense diodes 80 can become sufficiently low that diodes 80 become forward biased and conduct sense currents when memory cells 40 are addressed and are in the conductive state or the second resistance state. In the first and second embodiments, the difference between the $V_{BIAS}$ voltage and the −V voltage is sufficient to enable the diode sense line 82 to be reverse biased when the memory cells 40 are in the conductive state or the second resistance state.

In the first exemplary embodiment illustrated in FIG. 10, line 46/48 is a common row line 46 which is coupled to each one of the memory cells 40. In the first exemplary embodiment, lines 48/46 are column lines 48 which each couple to a corresponding memory cell 40.

In the second exemplary embodiment illustrated in FIG. 10, line 46/48 is a common column line 48 which is coupled to each one of the memory cells 40. In the second exemplary embodiment, lines 48/46 are row lines 46 which each couple to a corresponding memory cell 40.

Figure 11:
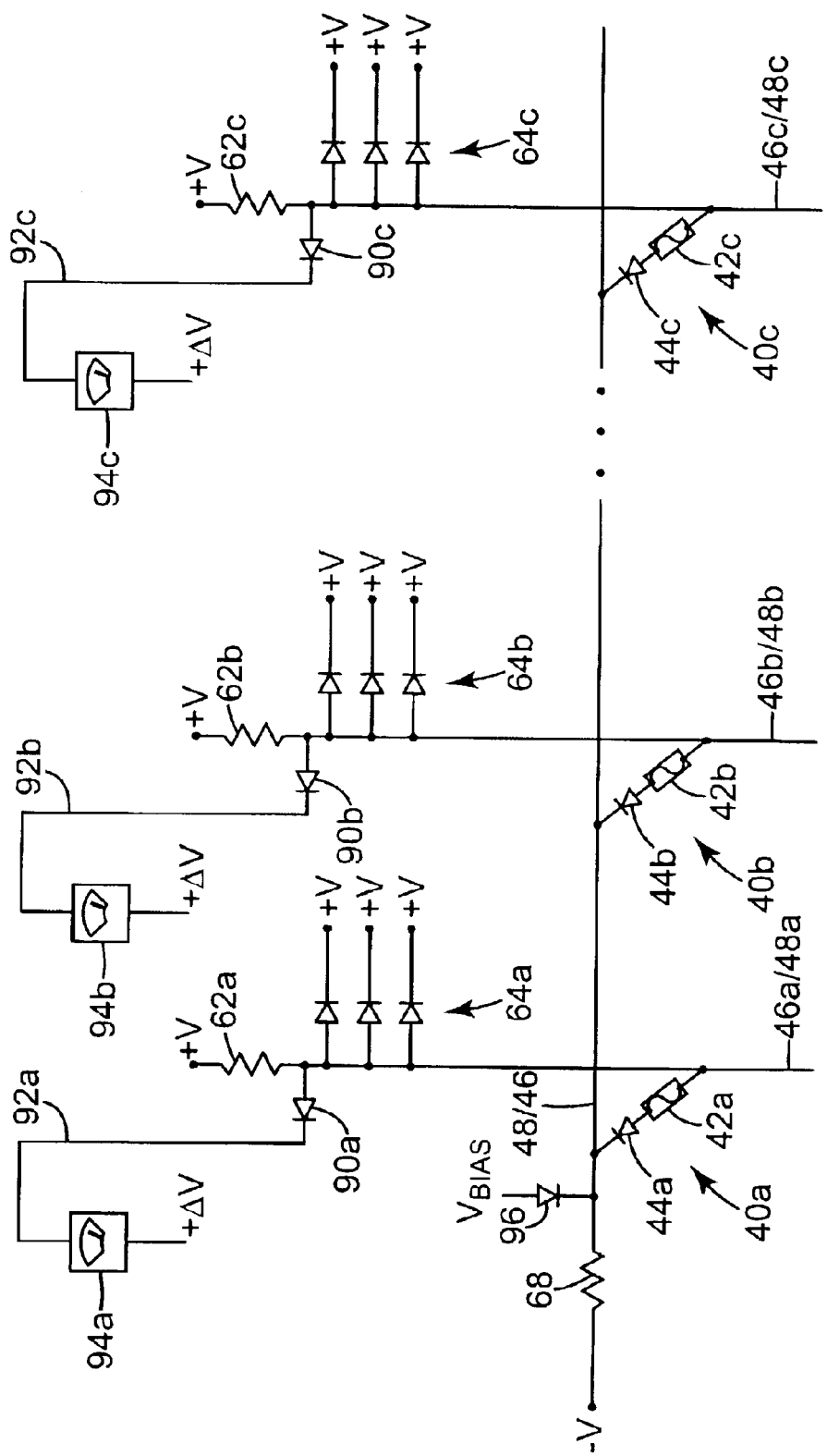
FIG. 11 is a schematic diagram illustrating third and fourth exemplary embodiments of the regulation circuit of FIG. 9 included in a partial memory cell array.

FIG. 11 is a schematic diagram illustrating third and fourth exemplary embodiments of the regulation circuit 96 of FIG. 9 included in a partial memory cell array 24. Three memory cells 40 are illustrated which are coupled to respective addressing circuits 64. Each of the three memory cells 40 are coupled between corresponding lines 46/48 and a common line 48/46. In the third and fourth exemplary embodiments, only three lines 46/48, three memory cells 40, and a common line 48/46 are illustrated to simplify the explanation of the invention. In other embodiments, any suitable number of lines 46/48, memory cells 40, and lines 48/46 can be used.

In the third and fourth exemplary embodiments illustrated in FIG. 11, each sense line 92 is coupled to a line 46/48 through a respective sense diode 90. Each diode 90 has an anode coupled to a corresponding line 46/48 and a cathode coupled to a sense current meter 94. In various embodiments, sense current meter 94 can be any suitable circuit function which is responsive to sense current flowing through sense line 92.

In the third and fourth exemplary embodiments illustrated in FIG. 11, each memory cell 40 is selected by addressing circuit 64 at line 46/48, because the cathodes of the diodes in addressing circuit 64 are at the +V voltage. Each memory cell 40 is also selected at line 48/46 by an addressing circuit which is not illustrated to simplify the description of the invention. For each memory cell 40 which is in the non-conductive state or the first resistance state, currents will flow through sense diodes 90 and sense lines 92. For each memory cell 40 which is in the conductive state or the second resistance state, no current will flow in corresponding sense lines 92.

In one embodiment, the bias level of +ΔV is set to a value which is suitably less than +V so that diodes 90 are forward-biased when the corresponding memory cells 40 are in the non-conductive state or the first resistance state. In one embodiment, the value of +ΔV is set to a value which is suitably greater than the value of $V_{BIAS}$ so that diodes 90 are reverse biased when the corresponding memory cells 40 are in the conductive state or the second resistance state. In one embodiment, these values of +ΔV define a detect margin for addressing circuits 64.

In the third and fourth exemplary embodiments illustrated in FIG. 11, a single-ended sensing approach is used. In the third and fourth exemplary embodiments, the sense current is conducted from the +V voltage source. In other embodiments, the sense current is conducted from the −V voltage source, or from both the +V and −V voltage sources.

In the third and fourth exemplary embodiments illustrated in FIG. 11, when two or more memory cells 40 are addressed and are in the non-conductive state or the first resistance state, currents are conducted between the multiple +V voltage sources and corresponding resistors 62 and the −V voltage source and resistor 68. Since the sense diodes 90 appear to be connected through the multiple resistors 62 in parallel, if $V_{BIAS}$ is set to be equal to the −V voltage, the sense margins are reduced. If the sense margins are reduced to a sufficiently low value, the voltage at the anodes of sense diodes 90 can become high enough that diodes 90 become forward biased and conduct sense currents when memory cells 40 are addressed and are in the conductive state or the second resistance state. In the third and fourth embodiments, the difference between the $V_{BIAS}$ voltage and the +V voltage is sufficient to enable the diode sense lines 92 to be reverse biased when the memory cells 40 are in the conductive state or the second resistance state.

In the third exemplary embodiment illustrated in FIG. 11, line 48/46 is a common column line 48 which is coupled to each one of the memory cells 40. In the third exemplary embodiment, lines 46/48 are row lines 46 which each couple to a corresponding memory cell 40.

In the fourth exemplary embodiment illustrated in FIG. 11, the line 48/46 is a common row line 46 which is coupled to each one of the memory cells 40. In the fourth exemplary embodiment, lines 46/48 are column lines 48 which each couple to a corresponding memory cell 40.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the chemical, mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A memory storage device, comprising:
    a memory cell configurable to have at least a first conductive state;
    a first and second conductor electrically coupled to the memory cell; and
    a regulation circuit configured to regulate a sense voltage on the second conductor to be independent of a current conducted through the first conductor when the memory cell is configured to have the first conductive state.

2. The memory storage device of claim 1, wherein the regulation circuit is coupled between a bias voltage and the first conductor and is configured to regulate a voltage on the first conductor to be approximately equal to the bias voltage.

3. The memory storage device of claim 2, further comprising:
    a first resistor coupled between a first voltage and the first conductor; and
    a second resistor coupled between a second voltage and the second conductor, wherein the bias voltage has a value which is between the first voltage and the second voltage.

4. The memory storage device of claim 3, wherein a difference between the bias voltage and the first voltage is greater than a product of a resistance of the first resistor and the current conducted through the first conductor when the memory cell is configured to have the first conductive state.

5. The memory storage device of claim 3, wherein the regulation circuit is a diode.

6. The memory storage device of claim 5, wherein the diode has an anode coupled to the first conductor and a cathode coupled to the bias voltage, and wherein the first voltage is a positive voltage and the second voltage is a negative voltage.

7. The memory storage device of claim 5, wherein the diode has a cathode coupled to the first conductor and an anode coupled to the bias voltage, and wherein the first voltage is a negative voltage and the second voltage is a positive voltage.

8. The memory storage device of claim 3, further comprising
    a diode sense line coupled to the second conductor, wherein a difference between the bias voltage and the second voltage is sufficient to enable the diode sense line to be reversed biased when the memory cell is configured to have the first conductive state.

9. The memory storage device of claim 1, wherein the memory cell before being programmed is configured to have a first resistive state, and wherein the memory cell after being programmed is configured to have the first conductive state, wherein the memory cell has a higher resistance in the first resistive state than in the first conductive state.

10. The memory storage device of claim 1, wherein the memory cell is configured to have a substantially non-conductive state before being programmed and is configured to have the first conductive state after being programmed.

11. A memory circuit formed on a substrate, comprising:
    at least two memory cells each configurable to have a first resistance state or a second resistance state;
    a first conductor coupled to the at least two memory cells and configured to conduct a current from the memory cells which are configured to have the second resistance state;
    at least two second conductors each coupled to a corresponding one of the at least two memory cells; and
    a regulation circuit configured to regulate a sense voltage on each of the at least two second conductors to be independent of the current conducted through the first conductor from the memory cells which are configured to have the second resistance state.

12. The memory circuit of claim 11, wherein the regulation circuit is coupled between a bias voltage and the first conductor and is configured to regulate a voltage on the first conductor to be approximately equal to the bias voltage.

13. The memory circuit of claim 12, further comprising:
    a first resistor coupled between a first voltage and the first conductor; and
    at least two second resistors each coupled between a second voltage and one of the at least two second conductors, wherein the bias voltage has a value which is between the first voltage and the second voltage.

14. The memory circuit of claim 13, wherein a difference between the bias voltage and the first voltage is greater than a product of a resistance of the first resistor and the current conducted through the first conductor when at least one of the at least two memory cells is configured to have the second resistance state.

15. The memory circuit of claim 13, wherein the regulation circuit is a diode.

16. The memory circuit of claim 15, wherein the diode has an anode coupled to the first conductor and a cathode coupled to the bias voltage, and wherein the first voltage is a positive voltage and the second voltage is a negative voltage.

17. The memory circuit of claim 15, wherein the diode has a cathode coupled to the first conductor and an anode coupled to the bias voltage, and wherein the first voltage is a negative voltage and the second voltage is a positive voltage.

18. The memory circuit of claim 13, further comprising
    at least two diode sense lines each coupled to a corresponding second conductor, wherein a difference between the bias voltage and the second voltage is sufficient to enable each one of the at least two diode sense lines to be reverse biased when corresponding ones of the at least two memory cells are configured to have the second resistance state.

19. The memory circuit of claim 11, wherein the at least two memory cells are configured to have the first resistance state before being programmed and are configured to have the second resistance state after being programmed, and wherein the at least two memory cells have a higher resistance in the first resistive state than in the second resistive state.

20. A regulation circuit for controlling a sense voltage in a memory storage device which includes at least two memory cells each configurable to have a first resistance state or a second resistance state, a first conductor coupled to the at least two memory cells and at least two second conductors each coupled to a corresponding one of the at least two memory cells, the regulation circuit comprising:

a diode coupled between a bias voltage and the first conductor configured to regulate a voltage on the first conductor to be approximately equal to the bias voltage and to regulate a sense voltage on each of the at least two second conductors to be independent of a current conducted through the first conductor from one or more of the at least two memory cells which are configured to have the second resistance state.

21. The regulation circuit of claim 20, further comprising:

a first resistor coupled between a first voltage and the first conductor; and at least two second resistors each coupled between a second voltage and one of the at least two second conductors, wherein the bias voltage has a value which is between the first voltage and the second voltage.

22. The regulation circuit of claim 21, wherein the diode has an anode coupled to the first conductor and a cathode coupled to the bias voltage, and wherein the first voltage is a positive voltage and the second voltage is a negative voltage.

23. The regulation circuit of claim 21, wherein the diode has a cathode coupled to the first conductor and an anode coupled to the bias voltage, and wherein the first voltage is a negative voltage and the second voltage is a positive voltage.

24. The regulation circuit of claim 21, further comprising at least two diode sense lines each coupled to a corresponding second conductor, wherein a difference between the bias voltage and the second voltage is sufficient to enable each one of the at least two diode sense lines to be reverse biased when corresponding ones of the at least two memory cells configured to have the second resistance state.

25. A memory array, comprising:

an array of memory cells each configurable to have a conductive state or a substantially non-conductive state;

an array of first conductors extending in a first direction and intersecting the array of memory cells and configured to conduct a current from the memory cells which are configured to have the conductive state;

an array of second conductors extending in a second direction and intersecting the array of memory cells; and an array of regulation circuits each electrically coupled to a corresponding first conductor, wherein each regulation circuit is configured to regulate a sense voltage on each one of the second conductors to be independent of a current conducted through the corresponding first conductor from one or more of the memory cells which intersect the corresponding first conductor and which are configured to have the conductive state.

26. A memory storage device, comprising:

a memory cell configurable to have a conductive state;

a first and second conductor electrically coupled to the memory cell; and means to regulate a sense voltage on the second conductor to be independent of a current conducted through the first conductor when the memory cell is configurable to have the conductive state.

27. The memory storage device of claim 26, wherein the means to regulate a sense voltage includes a diode.

28. A method of controlling a sense voltage, comprising:

providing a memory cell configurable to have a conductive state;

providing a first and second conductor electrically coupled to the memory cell; and regulating the sense voltage on the second conductor to be independent of a current conducted through the first conductor when the memory cell is configured to have the conductive state.

29. A method of controlling a sense voltage, comprising:

providing at least two memory cells configurable to have a first resistance state before being programmed and configurable to have a second resistance state after being programmed;

providing a first conductor coupled to the at least two memory cells;

providing at least two second conductors each coupled to a corresponding one of the at least two memory cells; and regulating the sense voltage on each of the at least two second conductors to be independent of a current conducted through the first conductor from one or more of the memory cells which are configured to have the second resistance state.

* * * * *